United States Patent
Lentine et al.

(10) Patent No.: US 7,092,471 B2
(45) Date of Patent: Aug. 15, 2006

(54) DIGITAL PHASE SYNCHRONIZATION CIRCUIT

(75) Inventors: Anthony L. Lentine, Holmdel, NJ (US); Ted K. Woodward, Holmdel, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 145 days.

(21) Appl. No.: 10/153,390

(22) Filed: May 22, 2002

(65) Prior Publication Data

US 2004/0202270 A1  Oct. 14, 2004

(51) Int. Cl.
*H04L 25/00* (2006.01)
*H03L 27/06* (2006.01)

(52) U.S. Cl. .................. 375/371; 375/374; 327/148; 327/149

(58) Field of Classification Search .......... 375/355, 375/371, 373, 374, 376, 354; 327/141, 161, 327/155–159, 144–150
See application file for complete search history.

(56) References Cited

U.S. PATENT DOCUMENTS

| | | | | |
|---|---|---|---|---|
| 5,349,612 A * | 9/1994 | Guo et al. | ................ | 375/371 |
| 5,400,370 A * | 3/1995 | Guo | ................ | 375/371 |
| 5,844,908 A * | 12/1998 | McCallan | ................ | 370/518 |
| 5,886,552 A * | 3/1999 | Chai et al. | ................ | 327/165 |
| 6,275,555 B1 * | 8/2001 | Song | ................ | 375/375 |
| 2001/0017905 A1 * | 8/2001 | Arima | ................ | 375/355 |
| 2002/0085656 A1 * | 7/2002 | Lee et al. | ................ | 375/355 |

* cited by examiner

*Primary Examiner*—Tesfaldet Bocure

(57) ABSTRACT

A synchronization circuit including a plurality of samplers, the plurality of samplers sampling an input signal with a plurality of respective clock signals and producing a plurality of respective sampled output signals. The synchronization circuit also includes at least one phase detector coupled to the plurality of samplers, the at least one phase detector determining whether the plurality of sampled output signals are different and producing at least one control signal, the at least one control signal indicating whether the plurality of sampled output signals are different. In addition, the synchronization circuit includes a delay adjuster coupled to the at least one phase detector, the delay adjuster adjusting a delay of the input signal according to the at least one control signal output by the at least one phase detector.

6 Claims, 4 Drawing Sheets

DIGITAL PHASE SYNCHRONIZATION CIRCUIT

BACKGROUND OF THE INVENTION

1. Field

The present application generally relates to a synchronization circuit and, more particularly, to a digital phase synchronization circuit for synchronizing clock signals and digital input signals.

2. The Related Art

Multiple integrated circuits often output signals that must be fed to a single integrated circuit. Signal skew can develop between the output signals from a variety of sources, including chip-chip variation and signal path differences. Further, clock skew on an integrated circuit can develop from the same sources. The signal and clock skew has been dealt with by equalizing signal path lengths and manually providing phase adjustment.

In addition, high speed systems designed with multiple integrated circuits rely on careful control of signal and clock traces to maintain phase alignment of multiple signals and clocks. Phase lock loops have been used in conjunction with first-in-first-out memories in high frequency applications to provide a clock interface between a clock recovered from the signal and the local clock on the integrated circuit. Such phase lock loops dissipate a lot of power, are only useful for a small number of inputs, for example, four inputs to a chip, and have a slow acquisition time.

What is needed is a digital phase synchronization circuit that uses a digitally controlled delay line in conjunction with at least one phase detector to change the delay in a signal path relative to a local clock. Also, there is a need for such a circuit that eliminates signal and clock skew with lower power dissipation and which can be used for a greater number of inputs.

SUMMARY OF THE INVENTION

An aspect of the present invention provides a synchronization circuit. The synchronization circuit includes a plurality of samplers, the plurality of samplers sampling an input signal with a plurality of respective clock signals and producing a plurality of respective sampled output signals, and at least one phase detector coupled to the plurality of samplers, the at least one phase detector determining whether the plurality of sampled output signals are different and producing at least one control signal, the at least one control signal indicating whether the plurality of sampled output signals are different. The synchronization circuit also includes a delay adjuster coupled to the at least one phase detector, the delay adjuster adjusting a delay of the input signal according to the at least one control signal output by the at least one phase detector.

A further aspect of the present invention provides a synchronization circuit. The synchronization circuit includes a first sampler, the first sampler sampling an input signal with a first clock signal and producing a first sampled output signal, a second sampler, the second sampler sampling the input signal with a second clock signal and producing a second sampled output signal, and a third sampler, the third sampler sampling the input signal with a third clock signal and producing a third sampled output signal. The synchronization circuit also includes a first delay unit coupled to the first sampler, the first delay unit delaying the first sampled output signal, a second delay unit coupled to the second sampler, the second delay unit delaying the second sampled output signal, a first phase detector coupled to the first delay unit and the second delay unit, the first phase detector determining whether the first sampled output signal and the second sampled output signal are different and producing a first control signal, the first control signal indicating whether the first sampled output signal and the second sampled output signal are different, and a second phase detector coupled to the second delay unit and the third sampler, the second phase detector determining whether the second sampled output signal and the third sampled output signal are different and producing a second control signal, the second control signal indicating whether the second sampled output signal and the third sampled output signal are different. Further, the synchronization circuit includes a controller coupled to the first phase detector and the second phase detector, the controller generating a delay signal according to the first control signal and the second control signal, and a third delay unit coupled to the controller, the third delay unit adjusting a delay of the input signal according to the delay signal.

BRIEF DESCRIPTION OF THE DRAWINGS

The invention is illustrated in the figures of the accompanying drawings which are meant to be exemplary and not limiting, in which like numerals refer to like or corresponding parts, and in which.

DETAILED DESCRIPTION

Figure 1:
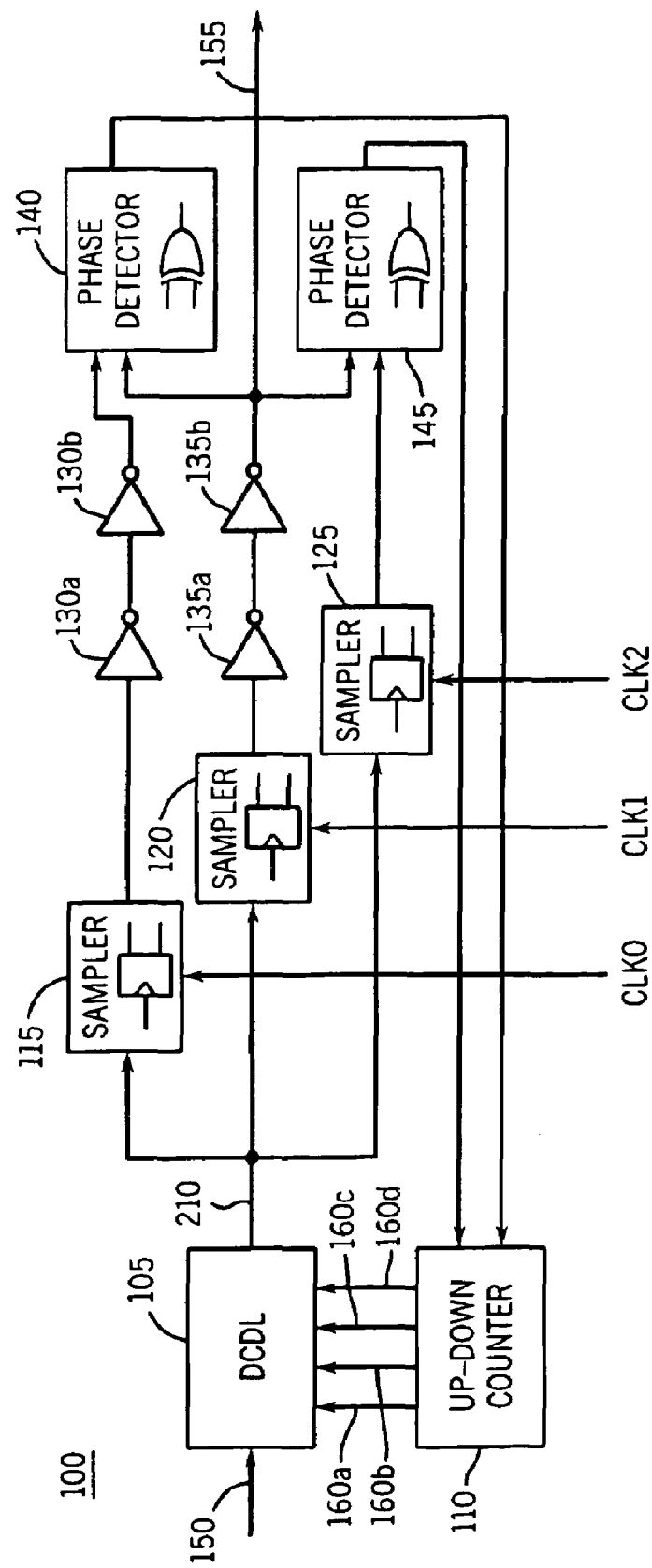
FIG. 1 shows an exemplary embodiment of a phase synchronization circuit of the present invention.

FIG. 1 illustrates an exemplary embodiment of a phase synchronization circuit 100 of the present invention. A digitally controlled delay line (DCDL) 105 receives a digital input signal 150. The DCDL 105 may be, for example, as described in U.S. patent application Ser. No. 09/665,005 and is incorporated herein by reference. The input signal 150 is delayed by the DCDL 105 according to the control signals 160a, 160b, 160c, 160d and then output to three samplers 115, 120, 125. In an exemplary embodiment of the present invention, the samplers are flip-flops. The samplers 115, 120, 125 also receive clock signals clk0, clk1, clk2, respectively. A delayed input signal 210 is sampled using clock signals clk0, clk1, clk2, each clock signal delayed by a predetermined equal amount with respect to the others during a bit interval. In an exemplary embodiment of the present invention, only one clock signal generates clock signals clk0, clk1, clk2 by using inverters to delay each clock signal by a predetermined equal amount with respect to the others during a bit interval. Devices other than inverters can be used to provide the necessary delay to the clock signals and a delay unit other than a DCDL may be used to provide an appropriate amount of delay to the input signal.

If the input signal 210 and clock signal clk1 are aligned, meaning that the sample obtained by sampler 120 is aligned in the middle of input signal 210, the other two samples obtained by samplers 115, 125 should also have the bit value of 1. If the three samples do not have the same bit value of 1, there is a transition either between the samples obtained by samplers 115, 120 or the samples obtained by samplers 120, 125. In an exemplary embodiment of the present invention, the transition is either from bit value 1 to bit value 0 or from bit value 0 to bit value 1. Depending on where the transition is, a delay adjuster increments or decrements the delay of the input signal 210. In an exemplary embodiment of the present invention, the delay adjuster includes an up-down counter 110 and the DCDL 105. Upon the next bit period, the samples may now be aligned provided enough delay was added or subtracted by up-down counter 110 and DCDL 105. More delay can be added or subtracted on subsequent bit periods so that eventually after a few bits depending on the delay step relative to the period the input signal 150 and clock signals clk0, clk1, clk2 are properly aligned.

In an exemplary embodiment of the present invention, the samplers 115, 120, 125 provide output signals equal to the value of the respective input signals at the time of a falling edge of the respective clock signals clk0, clk1, clk2. As a result of the clock signals clk0, clk1, clk2 being delayed with respect to each other, the samplers 115, 120, 125 provide a snap shot of the input signal 210 at different times. In a further exemplary embodiment of the present invention, the clock signals clk0, clk1, clk2 are delayed with respect to each other by a predetermined amount so that the total delay of the clock signals clk0, clk1, clk2 is less than the length of time of the bit interval of the input signal 210. As a result, the samplers 115, 120, 125 can provide three sample points 220a, 220b, 220c during the input signal 210, as shown in FIG. 2c.

Figure 2A:
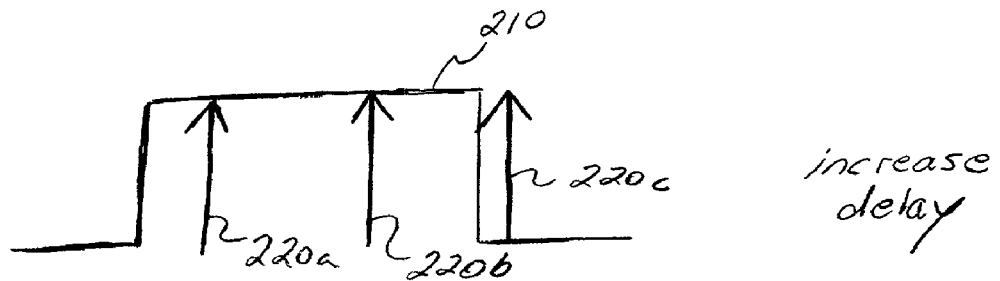
FIG. 2a shows an exemplary embodiment of an input signal sampled by clock signals of the present invention.

FIG. 2a illustrates the input signal 210 sampled by clock signals clk0, clk1, clk2. The three arrows or sampling points 220a, 220b, 220c represent the falling edges of the three clock signals clk0, clk1, clk2, respectively. As can be seen in FIG. 2a, the output of the three samplers 115, 120, 125 is 1, 1, 0, respectively, because the input signal 210 only has a value of 1 at the sampling points 220a and 220b. In order for the output of the three samplers 115, 120, 125 to be 1, 1, 1, respectively, as can be seen in FIG. 2c, the delay of the input signal 210 must be increased.

Figure 2B:
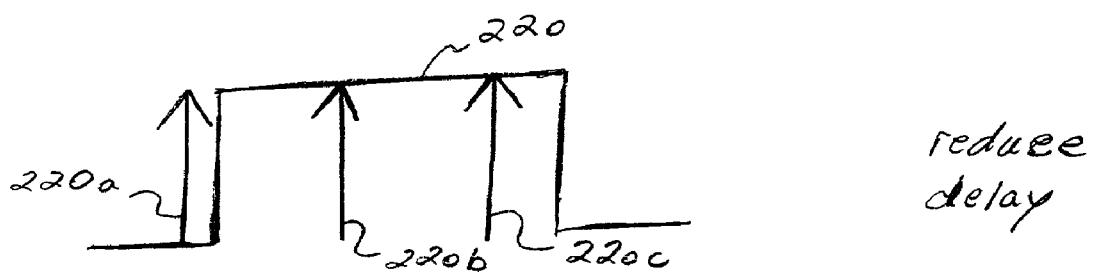
FIG. 2b shows an exemplary embodiment of an input signal sampled by clock signals of the present invention.
Figure 2C:
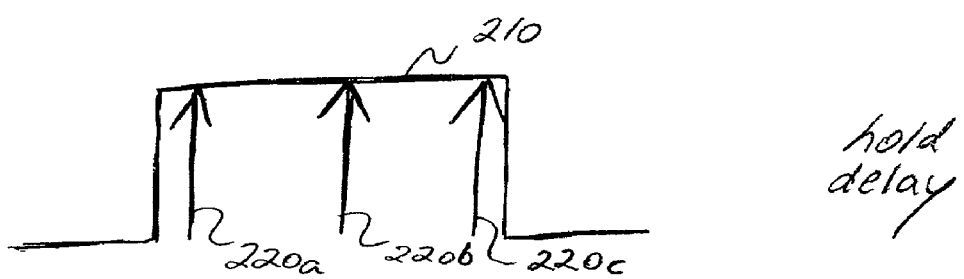
FIG. 2c shows an exemplary embodiment of an input signal sampled by clock signals of the present invention.

FIG. 2b depicts an input signal 220, whereby the output of the three samplers 115, 120, 125 is 0, 1, 1, respectively, because the input signal 220 only has a value of 1 during the sampling points 220b and 220c. In order for the output of the three samplers 115, 120, 125 to be 1, 1, 1, respectively, the delay of the input signal 220 must be decreased.

In an alternative embodiment of the present invention, the samplers 115, 120, 125 are rising edge flip-flops. Accordingly, the samplers 115, 120, 125 provide output signals equal to the value of the respective input signals at the time of a rising edge of the respective clock signals clk0, clk1, clk2.

The input signal 210 sampled by sampler 115 is then output to a delay unit including delay devices 130a, 130b, as can be seen in FIG. 1. Further, the input signal 210 sampled by sampler 120 is output to a delay unit including delay devices 135a, 135b. In an exemplary embodiment of the present invention, the delay devices 130a, 130b, 135a, 135b are inverters that each provide a predetermined delay. By using the delay devices 130a, 130b, 135a, 135b, the value of the input signal 210 sampled with clock signal clk0 and the value of the input signal 210 sampled with clock signal clk1 aligned in time with the value of the input signal 210 sampled with clock signal clk2. Specifically, the delay provided by delay devices 130a, 130b is approximately twice the delay of clock signal clk2 relative to clock signal clk0. The delay provided by delay devices 135a, 135b is approximately equal to the delay of clock signal clk2 relative to clock signal clk1.

The delayed signal output by delay device 130b and the delayed signal output by delay device 135b are then fed to phase detector 140. Further, the delayed signal output by delay device 135b and the sampled signal output by sampler 125 are fed to phase detector 145. Phase detectors 140, 145 determine whether there is any transition and if so, the location of the transition. Depending on where the transition is, delay is either added or subtracted to the input signal 210 so that the three samples all have the bit value of 1.

In an exemplary embodiment of the present invention, phase detectors 140, 145 are digital phase detectors which function as exclusive OR logical gates. The output of phase detector 140 has a bit value of 1 if the output by the delay device 130b and the output by delay device 135b are different. For example, the output by delay device 130b has a value of 0 and the output of delay device 135b has a value of 1, as shown in FIG. 2b. If the outputs by the delay devices 130b, 135b are the same, as shown in FIG. 2a, then the output of phase detector 140 has a bit value of 0. Similarly, the output of phase detector 145 has a bit value of 1 if the output of delay device 135b and the output of sampler 125 are different. For example, the output by delay device 135b has a bit value of 1 and the output of sampler 125 has a value of 0, as shown in FIG. 2a. However, if the outputs of delay device 135b and sampler 125 are the same, as shown in FIG. 2b, then the output of phase detector 145 has a bit value of 0. Phase detectors 140, 145 will both have a bit value of 0 when the outputs by delay devices 130b, 135b and sampler 125 are the same, as shown in FIG. 2c, for example each output has a bit value of 1.

In an exemplary embodiment of the present invention, when phase detector 140 has an output with a bit value of 1, the delay of the input signal 210 needs to be reduced. However, when phase detector 145 has an output with a bit value of 1, the delay of input signal 210 needs to be increased. Lastly, when phase detectors 140, 145 have outputs with a value of 0, additional or less delay is not needed.

The outputs of phase detectors 140, 145 are fed into a controller. In an exemplary embodiment of the present invention, the controller is up-down converter 110, as shown in FIG. 1. Depending on the value of the output signals of phase detectors 140, 145, up-down counter 110 is either increased, decreased or unchanged. In an exemplary embodiment of the present invention, if the output of phase detector 140 has a value of 1 and phase detector 145 has a value of 0, a value of up-down counter 110 is decreased. When the value of up-down counter 110 is decreased, the four bit control signal 160a, 160b, 160c, 160d output to DCDL 105 is decreased and the delay of the input signal 210 will be reduced. For example, if the value of up-down counter 110 is 1 0 0 0, the value will change to 0 1 1 1. Accordingly, the four bit control signal 160a, 160b, 160c, 160d output to DCDL 105 is 0 1 1 1 and DCDL 105 will reduce the delay of the input signal 210 by a predetermined amount. If the output of phase detector 145 has a bit value of 1 and phase detector 140 has a bit value of 0, a value of up-down counter 110 is increased. Further, the four bit control signal 160a, 160b, 160c, 160d output to DCDL 105 is increased and DCDL 105 increases the delay of the input signal 210 by a predetermined amount. Once the necessary amount of delay is increased or reduced, the output of phase detectors 140, 145 will have a bit value of 0 and clock signal clk1 will approximately be centered on output signal 155. Thus, the output signal 155 and clock signals clk0, clk1, clk2 will be aligned. In an exemplary embodiment of the present invention, the value of up-down counter 110 is initially set at 1 0 0 0.

In an exemplary embodiment of the present invention, the phase synchronization circuit 100 shown in FIG. 1 does not include sampler 125, clock signal clk2 and phase detector 145. As a result, the circuit 100 is only concerned with whether the outputs by delay devices 130*b*, 135*b* are different or the same. If the outputs by delay devices 130*b*, 135*b* are different, phase detector 140 outputs a signal having a bit value of 1 to up-down counter 110 in order to reduce the delay of input signal 210 via DCDL 105. In this exemplary embodiment of the present invention, the delay is only reduced until the input signal 210 is aligned with clock signals clk0, clk1. In an alternative embodiment of the present invention, either inverters 130*a*, 130*b* or inverters 135*a*, 135*b* are not utilized in the phase synchronization circuit 100.

Figure 3:
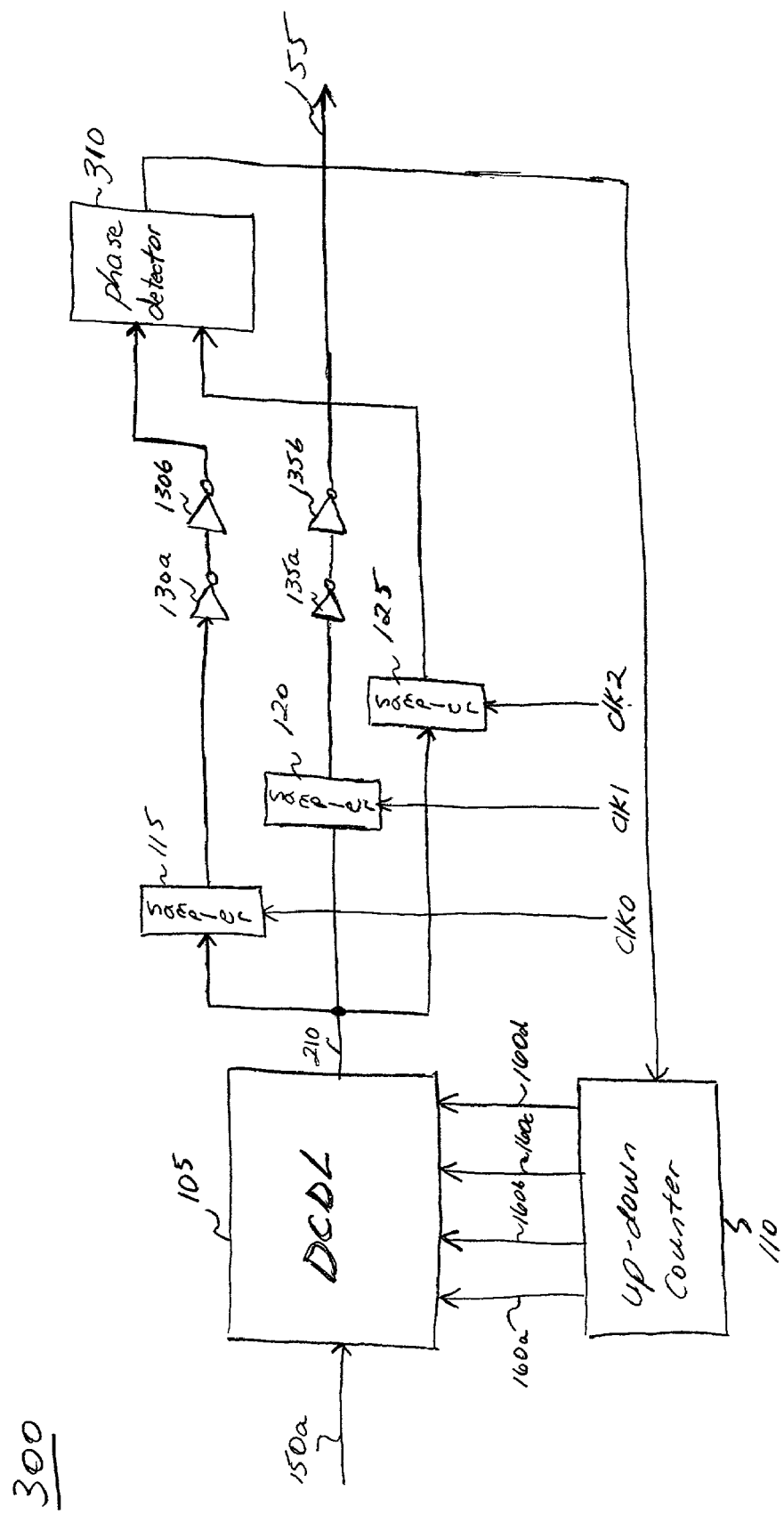
FIG. 3 shows an exemplary embodiment of a phase synchronization circuit of the present invention.

FIG. 3 illustrates a further exemplary embodiment of a phase synchronization circuit 300 of the present invention. Devices having like numerals refer to like or corresponding parts of FIG. 1 and are not explained again. The outputs of delay device 130*b* and sampler 125 are fed to phase detector 310. If the outputs by delay device 130*b* and sampler 125 are different, phase detector 310 outputs a signal having a bit value of 1 to up-down counter 110 in order to reduce the delay of input signal 210 via DCDL 105. In this exemplary embodiment of the present invention, the delay is only reduced until the input signal 210 is aligned with clock signals clk0, clk1, clk2. When the outputs by delay device 130*b* and sampler 125 are the same, for example, have a bit value of 1, the output from delay device 135*b* will necessary have a value of 1. FIG. 2*c* illustrates the situation when the outputs by delay device 130*b* and sampler 125 have a value of 1. As can be seen, the output of delay device 135*b* also has a value of 1.

Figure 4:
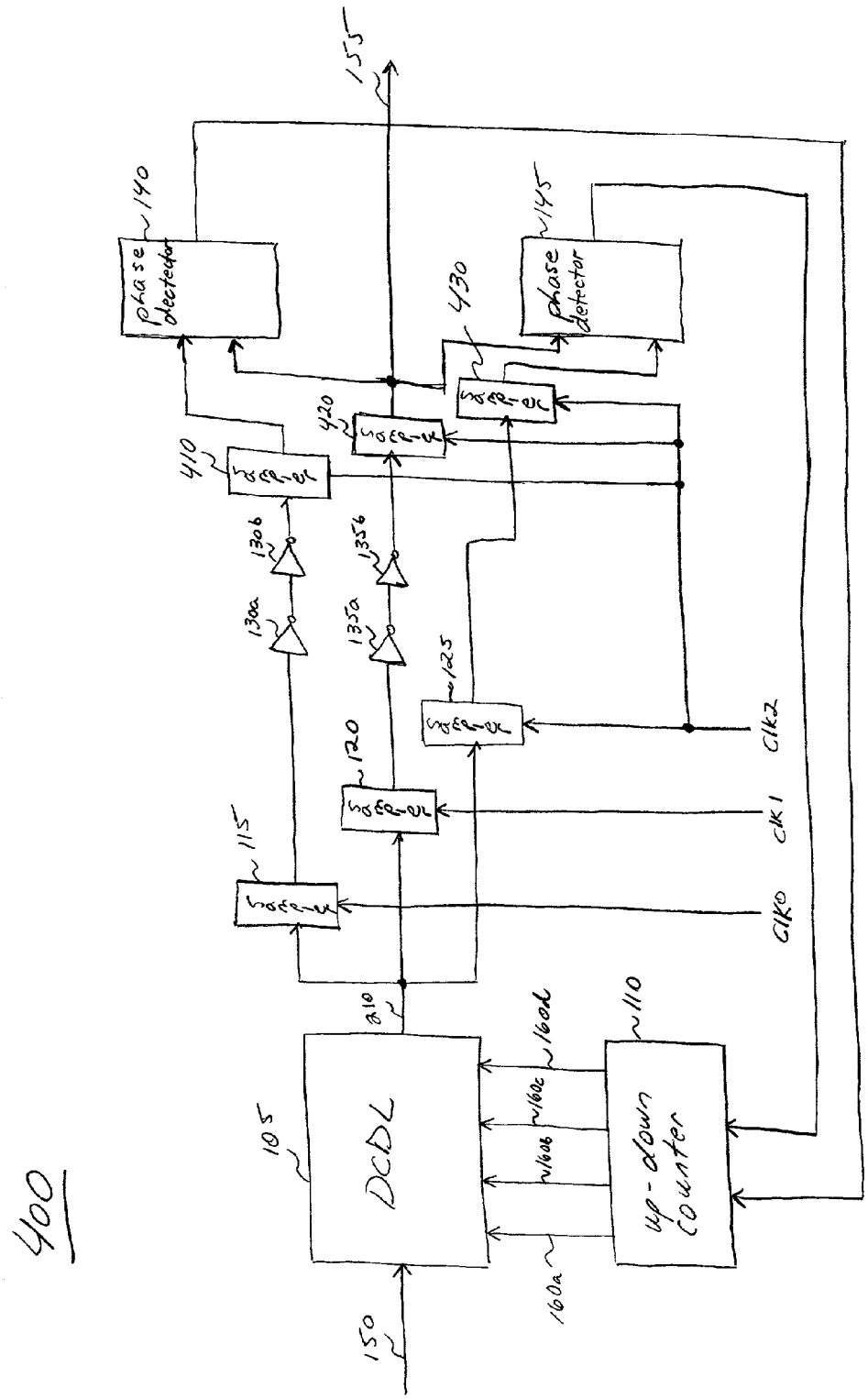
FIG. 4 shows an exemplary embodiment of a phase synchronization circuit of the present invention.

FIG. 4 illustrates a further exemplary embodiment of a phase synchronization circuit 400 of the present invention. Devices having like numerals refer to like or corresponding parts of FIG. 1 and are not explained again. The circuit shown in FIG. 4 includes samplers 410, 420, 430, each input with clock signal clk2. In an exemplary embodiment of the present invention, the samplers 410, 420, 430 are flip-flops. By resampling the output from delay device 130*b*, the output from delay device 135*b* and the output from sampler 125 with clock signal clk2, the value of the input signal 210 sampled with clock signal clk0 and the value of the input signal sampled with clock signal clk1 are aligned in time with the value of the input signal 210 sampled with clock signal clk2. In an alternative embodiment of the present invention, the circuit 400 includes either samplers 410, 420, 430 or delay devices 130*a*, 130*b*, 135*a*, 135*b*.

The embodiments described above are illustrative examples of the present invention and it should not be construed that the present invention is limited to these particular embodiments. Various changes and modifications may be effected by one skilled in the art without departing from the spirit or scope of the invention as defined in the appended claims.

We claim:

1. A synchronization circuit, comprising:

a plurality of samplers, the plurality of samplers sampling an input signal with a plurality of respective clock signals and producing a plurality of respective sampled output signals;

at least one delay unit coupled to output of the plurality of samplers, the at least one delay unit providing a predetermined delay to the sampled output signals;

at least one phase detector coupled to the output of at least one delay unit, the at least one phase detector determining whether the plurality of sampled output signals are different and producing at least one control signal, the at least one control signal indicating whether the plurality of sampled output signals are different; and an up-down counter coupled to an output of the at least one phase detector, the up-down counter adjusting a delay of the input signal according to the at least one control signal output by the at least one phase detector.

2. A synchronization circuit, comprising:

a first sampler, the first sampler sampling an input signal with a first clock signal and producing a first sampled output signal;

a second sampler, the second sampler sampling the input signal with a second clock signal and producing a second sampled output signal;

a third sampler, the third sampler sampling the input signal with a third clock signal and producing a third sampled output signal;

a first delay unit coupled to the first sampler, the first delay unit delaying the first sampled output signal;

a second delay unit coupled to the second sampler, the second delay unit delaying the second sampled output signal;

a first phase detector coupled to the first delay unit and the second delay unit, the first phase detector determining whether the first sampled output signal and the second sampled output signal are different and producing a first control signal, the first control signal indicating whether the first sampled output signal and the second sampled output signal are different;

a second phase detector coupled to the second delay unit and the third sampler, the second phase detector determining whether the second sampled output signal and the third sampled output signal are different and producing a second control signal, the second control signal indicating whether the second sampled output signal and the third sampled output signal are different;

a controller coupled to the first phase detector and the second phase detector, the controller generating a delay signal according to the first control signal and the second control signal; and a third delay unit coupled to the controller, the third delay unit adjusting a delay of the input signal according to the delay signal.

3. The synchronization circuit as set forth in claim 2, wherein the first sampler, the second sampler and the third sampler are flip-flop devices.

4. The synchronization circuit as set forth in claim 2, wherein the first delay unit and the second delay unit include a plurality of inverters.

5. The synchronization circuit as set forth in claim 2, wherein the first phase detector and the second phase detector are exclusive OR logical gate devices.

6. A synchronization method, comprising:
sampling an input signal with a plurality of respective clock signals and for producing a plurality of respective sampled output signals;
providing a predetermined delay to the sampled output signals;
determining whether the plurality of sampled output signals are different and for producing at least one control signal, the at least one control signal indicating whether the plurality of sampled output signals are different; and
adjusting a delay of the input signal according to the at least one control signal.

* * * * *